United States Patent [19]

Degle et al.

[11] Patent Number: 4,982,177

[45] Date of Patent: Jan. 1, 1991

[54] ARRANGEMENT FOR MONITORING THE TEMPERATURE IN FLOW SOLDERING OF FLAT MODULES

[75] Inventors: Walter Degle, Bobingen; Helmut Mueller, Augsburg, both of Fed. Rep. of Germany

[73] Assignee: Siemens Aktiengesellschaft, Berlin and Munich, Fed. Rep. of Germany

[21] Appl. No.: 424,072

[22] Filed: Oct. 19, 1989

[30] Foreign Application Priority Data

Oct. 19, 1988 [DE] Fed. Rep. of Germany ....... 3835650

[51] Int. Cl.$^5$ ...................... G08B 17/00; B23Q 15/00
[52] U.S. Cl. ......................................... 340/584; 228/9
[58] Field of Search ...................... 340/584; 228/8–9; 72/13; 148/128; 118/666

[56] References Cited

U.S. PATENT DOCUMENTS

| 3,750,134 | 7/1973 | Weisend | 340/584 X |
| 4,447,805 | 5/1984 | Omae et al. | 340/584 X |
| 4,596,615 | 6/1986 | Matsuzaki et al. | 148/128 |
| 4,632,291 | 12/1986 | Rahn et al. | 228/9 |
| 4,659,003 | 4/1987 | Simonetti | 228/8 |
| 4,890,781 | 1/1990 | Johnson et al. | 228/8 X |

Primary Examiner—Joseph A. Orsino
Assistant Examiner—Thomas J. Mullen, Jr.
Attorney, Agent, or Firm—Hill, Van Santen, Steadman & Simpson

[57] ABSTRACT

A pyrometer is located beneath a soldering path downstream of a flow nozzle and is shielded by a metal plate which extends transversely relative to the soldering direction and obliquely upwardly toward the path. The pyrometer is connected to a limit value generator which responds when the limit value is exceeded.

5 Claims, 1 Drawing Sheet

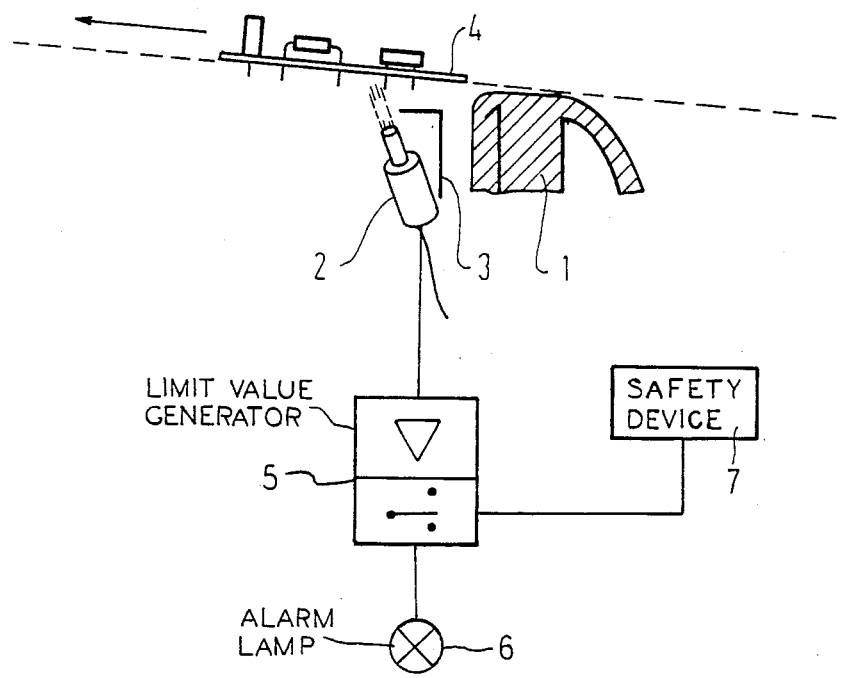

ARRANGEMENT FOR MONITORING THE TEMPERATURE IN FLOW SOLDERING OF FLAT MODULES

BACKGROUND OF THE INVENTION

1. Field of the Invention

The present invention is directed to an arrangement for monitoring the temperature of flow soldering in flat modules, and more particularly into such an arrangement which uses a pyrometer which is shielded from the solder flow with a metal plate immediately following the flow nozzle and in which the pyrometer is connected to a limit value generator which operates when an allowable limit temperature of the flat module is exceeded.

2. Description of the Prior Art

An overheating of flat modules is not absolutely impossible during flow soldering. Operational outages are a consequence. This condition can occur in parameter-control soldering systems as well as in conventional, rigid soldering systems. Possible reasons for this are that the controllable parameters are incorrectly set, fixed parameters are incorrectly set forth, an incorrect soldering program is engaged or control errors occur. Furthermore, the parameters can lie in the allowable range of tolerance, but can all lie in the extreme positive range thereof.

SUMMARY OF THE INVENTION

An object of the present invention is to provide an arrangement which avoids overheating of flat modules during soldering.

The above object is achieved, according to the present invention, in an arrangement of the type set forth above which employs a pyrometer that is shielded from the solder flow in the upward direction by a sheet metal plate immediately after the flow nozzle, the plate being arranged transversely relative to the soldering direction and obliquely upward against the flat module to be soldered. The pyrometer is connected to a limit value generator that responds to an allowable limit temperature of the flat module is exceeded.

When the allowable limit value of the temperature is exceeded, an alarm device can be actuated, for example, in the form of a warning light or a safety mechanism for, for example, stopping the system. It is therefore also possible to influence the parameters, for example, the soldering rate, by means of the safety mechanism.

What is achieved with these measures is that operational outages of flat modules are reduced in number, less reworking is required and fewer discards of expensive modules result.

BRIEF DESCRIPTION OF THE DRAWING

Other objects, features and advantages of the invention, its organization, construction and operation, will be best understood from the following detailed description, taken in conjunction with the accompanying drawing, on which there is a single FIGURE which is a schematic representation of a flow soldering process and the structure required for practicing the present invention.

DESCRIPTION OF THE PREFERRED EMBODIMENT

The invention shall be set forth below in greater detail with reference to an exemplary embodiment. Referring to the drawing, a flat module 4 is equipped with electronic components and is conducted over a flow nozzle 1 for the purpose of soldering components onto the module. A pyrometer 2 is arranged beneath the flat module and is directed transversely relative to the direction of motion and obliquely toward the flat module. In order to reduce the radiant effect, to limit the ambient temperature of the pyrometer to the necessary 35° C. and to simultaneously protect the pyrometer against spattering solder, a shield plate 3 covers the pyrometer in the upward direction and toward the side of the solder flow. An air stream can be provided around the pyrometer in order to avoid contamination of the radiation receiver of the pyrometer.

The pyrometer is connected to a limit value generator 5 which includes a signaling device, such as an alarm lamp 6 which responds when an allowable limit value is exceeded. The limit value generator may also be connected to a shut-off device 7 which is actuated when the allowable limit value of the temperature is exceeded.

Although we have described our invention by reference to particular illustrative embodiments thereof, many changes and modifications of the invention may become apparent to those skilled in the art without departing from the spirit and scope of the invention. We therefore intend to include within the patent warranted hereon all such changes and modifications as may reasonably and properly be included within the scope of our contribution to the art.

We claim:

1. An arrangement for monitoring the temperature in flow soldering of flat modules which are moved along a path, comprising:
   a flow nozzle beneath the path;
   a pyrometer beneath the path spaced downstream of said flow nozzle;
   a sheet metal shield located between said flow nozzle and said pyrometer and oriented transversely relative to the flow direction and obliquely upward toward the path; and
   a limit value generator connected to said pyrometer and operable to produce an alarm in response to the temperature exceeding an allowable limit for a flat module.

2. The arrangement for monitoring the temperature in flow soldering of flat modules according to claim 1, wherein: said limit value generator comprises a signaling device.

3. An arrangement for monitoring the temperature in flow soldering of flat modules according to claim 2, wherein:
   said signaling device comprises an alarm lamp which is operated when the allowable limit value is exceeded.

4. An arrangement for monitoring temperature in flow soldering of flat modules according to claim 1 and further comprising:
   a safety mechanism including a system shut-off device connected to said pyrometer and operated when the allowable limit value of the temperature is exceeded.

5. An arrangement for monitoring temperature in flow soldering of flat modules according to claim 1, and further comprising:
   means connected to said pyrometer and operable to influence process-relevant parameters including the soldering rate, when the allowable limit value of the temperature is exceeded.

* * * * *